United States Patent
Anderson et al.

(12) 
(10) Patent No.: US 6,356,126 B1
(45) Date of Patent: Mar. 12, 2002

(54) METHODS AND DEVICES FOR TESTING THE OPERATION OF COUNTERS USED IN PHASE-LOCKED LOOPS

(75) Inventors: David L. Anderson, Kutztown; Naresh Gupta, Berwyn; Thomas L. Shewell, Oley; Thomas F. Strelchun, Mertztown, all of PA (US)

(73) Assignee: Agere Systems Guardian Corp.

( * ) Notice: Subject to any disclaimer, the term of this patent is extended or adjusted under 35 U.S.C. 154(b) by 0 days.

(21) Appl. No.: 09/612,980

(22) Filed: Jul. 10, 2000

(51) Int. Cl.[7] .................................................. H03L 7/00
(52) U.S. Cl. ........................................ 327/151; 327/154
(58) Field of Search .................................. 327/156, 160, 327/147, 151, 336, 339, 344, 551

(56) References Cited

U.S. PATENT DOCUMENTS

| | | | | |
|---|---|---|---|---|
| 4,263,555 A | * | 4/1981 | Hunka | 327/323 |
| 4,390,844 A | * | 6/1983 | Ting | 327/345 |
| 4,802,009 A | * | 1/1989 | Hartmeier | 348/537 |
| 5,027,373 A | * | 6/1991 | Cok | 375/324 |
| 5,929,677 A | * | 7/1999 | Murata | 327/157 |

* cited by examiner

Primary Examiner—Toan Tran
Assistant Examiner—Cassandra Cox
(74) Attorney, Agent, or Firm—John E. Curtin; James E. Schutz; Troutman Sanders LLP

(57) ABSTRACT

Intermittent miscounts generated by counters used in a phase-locked loop ("PLL") are precisely measured by detecting changes to a predetermined waveform, such as a sawtooth waveform. The miscounts are detected using an open loop, not closed loop, set-up which comprises two separate signal generators feeding two separate frequencies into MAIN and REF counters of a PLL. Offsetting the frequencies slightly and integrating an output generates the predetermined waveform. Thereafter, miscounts can be detected by comparing waveforms corresponding to miscounts to theoretically predicted, predetermined waveforms.

18 Claims, 3 Drawing Sheets

METHODS AND DEVICES FOR TESTING THE OPERATION OF COUNTERS USED IN PHASE-LOCKED LOOPS

BACKGROUND OF THE INVENTION

A PLL is an electronic circuit which is widely used to generate highly stable signals for electronic and communication devices, such as wireless telephones and the like. More specifically, a PLL is used to control the frequency of a signal generated by a voltage controlled oscillator ("VCO") or the like. VCOs are used in almost every communications device. For example, wireless telephones communicate with one another and with wireless networks using signals generated by VCOs embedded within such telephones. The signals generated by VCOs are then used to transmit voice and data messages.

Today's modem communication devices require that signals generated by a VCO be stable and accurate. That is, for a telephone to work properly, for a telephone to communicate with another wireless telephone or a wireless network a VCO's signal must be accurate (i.e., maintained within a narrow range).

Enter the PLL. A simplified, typical PLL circuit 100 is shown in FIG. 1. As shown, a VCO 1 outputs a signal (referred to as "$VCO_{out-freq}$") along pathway 8. This signal may be any frequency, but for the following example, it will be assumed to be in megahertz ("MHz"). This is a fair assumption considering the typical frequencies used by wireless devices. It should be understood that the present invention envisions frequencies in the MHz and gigahertz ("GHz") range as well, however. That said, strictly speaking, the methods and devices envisioned by the present invention can utilize any frequency, not just MHz or GHz.

To insure that the signal output by the VCO 1 remains accurate, its output is also fed back to a MAIN counter 2 along pathway 9a. This counter 2 is designed to accept $VCO_{out-freq}$ and to divide this frequency down by an amount dictated by a MAIN counter setting to generate a "PM" signal 7b. The PM signal is one of two signals input into a phase detector 11. The second signal is input from a reference counter ("REF counter") 3. The REF counter 3 also supplies a signal ("PR") 7a along pathway 10a. The signal supplied by the REF counter 3 originates with a signal generator 5 which is adapted to output a signal whose frequency is maintained within a specific, narrow range. It can be said that the signal generator 5 acts as a reference source. That is, the output of the VCO 1 can be compared against the signal output from the signal generator 5 to make sure the frequency of the signal output by the VCO 1 stays within an acceptable range.

Backtracking somewhat, the REF counter 3 and MAIN counter 2 are adapted to divide down the frequencies of their respective inputs 9a, 9b such that:

$$PR_{freq} = REF\ IN_{freq}/REF_{setting} \quad (1)$$

and $$PM_{freq} = VCO_{out-freq}/MAIN_{setting} \quad (2)$$

where $PR_{freq}$ is the frequency of the PR signal 7a output from the REF counter 3; $REF\ IN_{freq}$ is the frequency of the signal 9b input from the signal generator 5; $REF_{setting}$ is an amount that controls the "divide down" function of the REF counter 3; $PM_{freq}$ is the frequency of the PM signal 7b output from the MAIN counter 2; $MAIN_{setting}$ is an amount that controls the "divide down" function of the MAIN counter 2; and $VCO_{out-freq}$ is the frequency of the signal input into the MAIN counter 2 from the VCO 1 along pathway 9a.

In a typical PLL, the REF counter 3 and MAIN counter 2 settings are intentionally set so that the $PR_{freq}$ and $PM_{freq}$ are exactly equal. This implies:

$$REF\ IN_{freq}/REF_{counter\ setting} = VCO_{out-freq}/MAIN_{setting}. \quad (3)$$

As shown in FIG. 1, the phase detector 11 is adapted to receive both the PR 7a and PM 7b signals. Thereafter, the phase detector 11 is further adapted to output a signal 7c based on the frequency and phase of the PR and PM signals 7a, 7b. For example, if the PR and PM signals have the same frequency and phase, the phase detector will not output a signal. As is known in the art, loop filter 6 typically comprises a capacitance whose stored charge maintains a constant voltage input into VCO 1 (i.e., "the loop is considered locked"). However, if the PR and PM signals 7a, 7b are not in agreement, the phase detector 11 is adapted to output an error signal to the charge pump 4. Upon receipt of this error signal, the charge pump 4 is adapted to supply a necessary current to the loop filter 6 which in turn adjusts the voltage which is input into the VCO 1. By changing the voltage input into the VCO 1, the frequency of $VCO_{out-freq}$ is changed. This change in frequency is designed to "drive" or control the operation of the VCO 1 so that $VCO_{out-freq}$ remains stable. Said another way, the PLL is considered stable when the PR and PM signals agree in frequency and phase. When this occurs, $VCO_{out-freq}$ will be maintained at a stable, set value.

From equation (3), $VCO_{out-freq}$ can be defined as:

$$VCO_{out-freq} = REF\ IN_{freq} * MAIN_{setting}/REF_{counter\ setting}. \quad (4)$$

As may be apparent from the discussion above, to insure that the correct adjustment is made to the VCO 1, it was assumed that the MAIN and REF counters 2,3 were operating accurately. If either one or both of the counters are not operating accurately, then it will be difficult to correctly adjust the VCO 1.

Many things may cause a MAIN or REF counter to output an inaccurate signal. Sometimes the counter becomes inoperative over time. More frequently, however, a counter is operating correctly but receives a signal (e.g., from a VCO or another source) which causes it to output an inaccurate signal. For example, design limitations may dictate that the MAIN counter 2 shown in FIG. 1 will output a PM signal only after receiving a signal from the VCO 1 which is greater than a certain threshold. If the VCO output (which is input into the MAIN counter 2) falls below this threshold, no PM signal will be output. In actuality, there is an upper and lower limit to this threshold such that only those signals falling within the range of signals between both limits will cause the MAIN counter 2 to output a PM signal. The lower limit is known as the "sensitivity" of a counter while the upper limit is known as the "saturation" of a counter.

On occasion, however, a signal falls just below or just above the limits of a counter. Sometimes these signals are so close to either limit that they trigger the counter to output a signal. These circumstances typically occur intermittently and are, for the most part, unpredictable. Nonetheless, to the extent possible, it is important to know when such circumstances might occur because once a counter has output an erroneous PM or PR signal it will adversely affect the ultimate frequency output by a VCO.

Realizing this, most manufacturers test REF and MAIN counters to determine whether they will produce miscounts when signals below, within or above the sensitivity and saturation limits are applied to the counters.

Up until now, however, the techniques used to test for such miscounts have been inadequate. Sometimes the techniques lack the ability to detect such intermittent miscounts. Other times, these techniques require additional circuitry. In each case, the techniques are "closed loop". That is, the techniques require a MAIN counter to be connected to a VCO forming a closed loop.

Accordingly, it is desirable to provide for methods and devices for testing the operation of counters used in PLLs which are capable of detecting intermittent miscounts.

It is also desirable to provide for methods and devices for testing the operation of counters used in PLLs which do not require a closed loop.

Other desires, features and advantages of the present invention will become apparent to those skilled in the art from the following description taken in conjunction with the accompanying drawings.

SUMMARY OF THE INVENTION

In accordance with the present invention there are provided methods and devices for testing the operation of MAIN and REF counters used in a PLL.

To test the operation of these counters, including, but not limited to their sensitivity and saturation limits, first and second signal generators feed first and second signals into MAIN and REF counters, respectively. The frequency of the PM and PR signals are offset slightly to generate a difference signal which, when integrated, comprises a predetermined, small beat frequency waveform, such as a sawtooth waveform. This predetermined waveform comprises a predictable slope.

The first or second signals are then adjusted or altered to test the limits of the MAIN or REF counter. When an adjustment causes one of the counters to miscount, an altered, integrated signal will be output from a charge pump.

This altered waveform is compared to the predetermined waveform to test the limits of both counters.

The present invention and its advantages can be best understood with reference to the drawings, detailed description of the preferred embodiments and claims that follow.

DETAILED DESCRIPTION OF THE INVENTION

Figure 1:
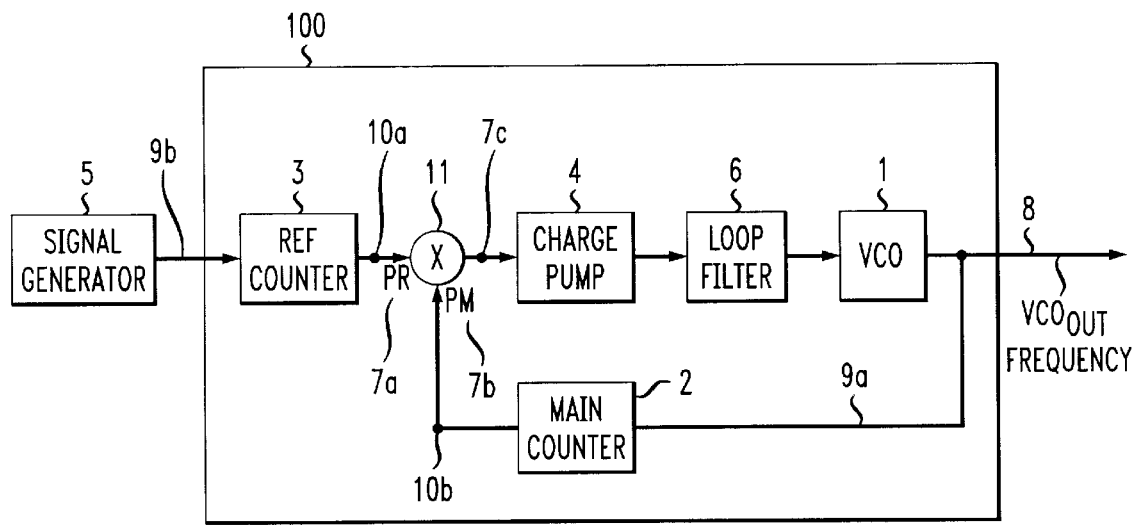
FIG. 1 depicts a typical PLL.
Figure 2:
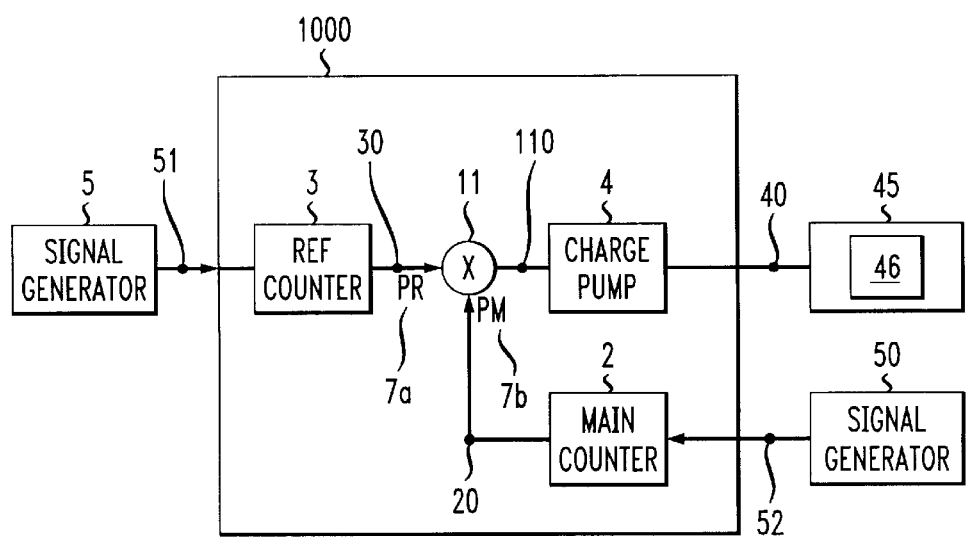
FIG. 2 depicts an example of a set-up which can be used to determine the operation of counters according to one embodiment of the present invention.

Referring to FIG. 2, there is shown a PLL stabilization unit 1000 comprising a first and second counter 2,3, which may comprise substantially the same counters as the MAIN and REF counters in FIG. 1, phase detector 11 and charge pump 4. Unlike FIG. 1, however, the input to the MAIN counter 2 is supplied by first signal generator or means 50, not VCO 1. In fact, the VCO 1 has been removed entirely. By removing the VCO 1, the PLL stabilization unit 1000 can be described as an "open" loop circuit as opposed to the closed loop circuit shown in FIG. 1. The balance of the set-up shown in FIG. 2 comprises second signal generator or means 5 and a voltage sampling unit 45. To avoid confusion, signal generators 50 and 5 will be referred to as "first" and "second" signal generators though these designations are arbitrary and may, if appropriate, be reversed.

Before going further, some comments regarding terminology may prove helpful. Within the field of engineering, it is commonplace to refer to both the device 100 in FIG. 1 and the PLL stabilization unit in FIG. 2 as PLLs. For clarity sake, however, the following discussion will refer to the device 100 in FIG. 1 as a PLL while the unit 1000 in FIG. 2 will be referred to as a PLL stabilization unit. Those skilled in the art may also refer to the unit 1000 as a "PLL chipset" or the like. Further, it should be understood that unit 1000 and device 100 may comprise one or more integrated circuits or discrete devices.

An example of how the set-up shown in FIG. 2 can be used to determine the operation of a MAIN and/or REF counter is as follows.

Figure 3A:
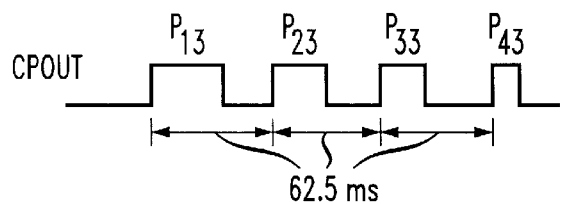
FIGS. 3a and 3b depict a pulse train and waveform, respectively, output by an accurately operating PLL stabilization unit according to one embodiment of the present invention.
Figure 3B:
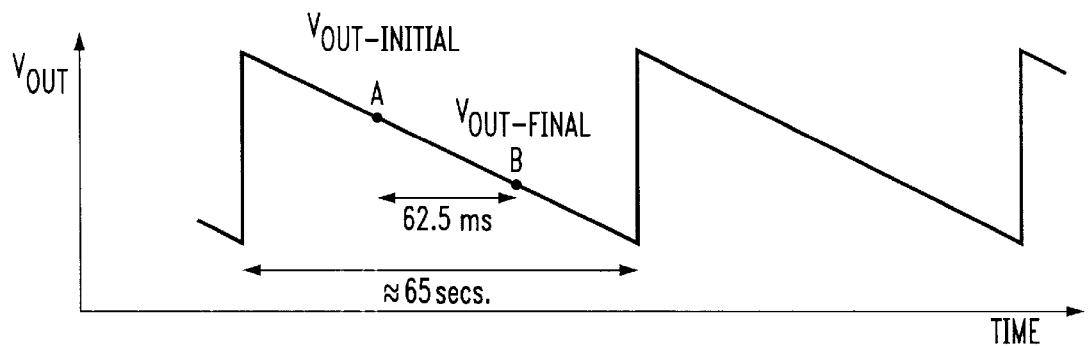

First signal generator 50 inputs a first signal at a first predetermined frequency along pathway 52 into first counter 2 which maybe a REF or MAIN counter while, at the same time, second signal generator 5 inputs a second signal at a second predetermined frequency along pathway 51 into a second counter 3 which may also be a REF or MAIN counter. In an illustrative embodiment of the invention, the signal generators 50,5 are adapted to output frequencies that are intentionally skewed or offset from one another so that when the PM and PR signals 7a, 7b are input into the phase detector 11, the detector is adapted to generate a "difference" signal 110, as shown in FIG. 3a. An integrator 46 is then adapted to generate a predetermined, sawtooth waveform comprising a small beat frequency (<<1 Hz), as shown in FIG. 3b, from the difference signal.

A practical example may prove helpful. If the MAIN counter 2 is set at a divide down of 131,135 and is fed an input signal having a frequency of 2098.16 MHz from signal generator 50 and the REF counter 3 is set at a divide down of 650 and receives an input signal from signal generator 5 having a frequency of 10.40001 MHz, then these settings will result in a PM signal of 16.000 KHz and a PR signal of 16.0000154 KHz.

Because the frequency of the PM signal is slightly less than the frequency of the PR signal, the pulse width of the signal 40 (referred to as "CPOUT") output by the charge pump 4 will decrease linearly until its duty cycle reaches zero. At this point the charge pump 4 will swing to the opposite rail forcing the duty cycle to 100 percent. The process then repeats itself with the pulse width of CPOUT again decreasing linearly. An example of CPOUT is shown in FIG. 3a.

In an illustrative embodiment of the invention, CPOUT is then fed into integrator or integrating means 46. The integrator 46 is adapted to integrate CPOUT to generate a predetermined waveform. This waveform is then fed to amplifier or amplifying means 47 (see FIG. 5) which is adapted to amplify the waveform's voltage to $V_{out}$. An example of $V_{out}$ generated by integrator 46 and amplifier 47 is shown on FIG. 3b. Again, the waveform shown in FIG. 3b will be recognized by those skilled in the art as a sawtooth waveform; the same predetermined waveform mentioned before. The frequency of this sawtooth waveform is referred to as the beat frequency and is given by:

Beat freq=PR−PM (5)

Using, for example, the values of PM and PR given above, the beat frequency becomes:

16000.0154 HZ−16000 Hz=0.0154 Hz (6)

Figure 5:
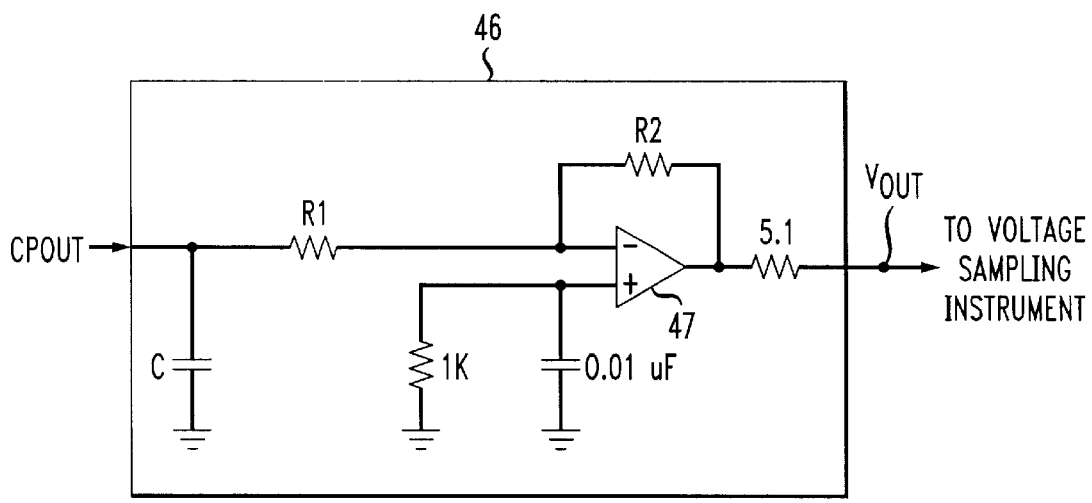
FIG. 5 depicts an example of an integrator used to determine the operation of counters according to one embodiment of the present invention.

Thus, in an illustrative embodiment of the present invention, when the counters 2, 3 are counting accurately, a beat frequency of 0.0154 Hz should be observed at $V_{out}$. Because the change in $V_{out}$ is linear, the predicted slope of $V_{out}$ can be calculated as:

Slope of $V_{out}$=−1*$V_{out\ max}$*Beat freq=6.075V*0.0154 Hz=−0.094 (7)

where $V_{out\ max}$=CPOUT$_{max-current}$*R2 and where it is assumed that CPOUT$_{max-current}$ is equal to 2.5 mA and R2 is equal to 2.43 Kohms (see FIG. 5).

Referring again to FIG. 3b, the slope of $V_{out}$ can also be calculated using the slope of the line between an initial $V_{out}$ point "A" and final $V_{out}$ point "B." In an illustrative embodiment of the invention, the time which elapses between these two points is 62.5 milliseconds. This time is roughly equal to 1000 "comparison cycles" where one cycle is the time within which a miscount might occur, or roughly 62.5 us. In an illustrative embodiment of the present invention, the time which elapses between these two points is referred to as a "wait" time. In general, this wait time may be as low as the minimum comparison period.

The discussion above focused on the generation of a predetermined, sawtooth waveform by offsetting the frequencies of PR and PM slightly. This sawtooth waveform can be detected and/or displayed by a voltage sampling instrument 45, which may comprise a high-resolution, voltage sampling oscilloscope.

If the MAIN and REF counters 2,3 are operating accurately, then the predetermined waveform will continue to be detected by voltage sampling unit 45. If not (i.e., if a miscount occurs), an altered erroneous waveform will be detected. In an illustrative embodiment of the present invention, the altered waveform will comprise a waveform whose slope varies from the predicted slope of the predetermined waveform. An example of how an altered waveform can be detected is as follows.

Before proceeding, it should be understood that the detection of an altered waveform is one way to test the sensitivity and saturation limits of counters 2,3. That is, if a signal input into counters 2,3 falls above or below a counter's sensitivity/saturation limits and cause miscounts, then an altered waveform will be generated.

In order to test the sensitivity and saturation levels of the counters 2,3, pass/fail counter thresholds must be set which allows the predetermined waveform to be detected but which also enables miscounts to be detected. In an illustrative embodiment of the present invention, the thresholds are set to accept a range of +/− half the DC shift of one miscount. In a further illustrative embodiment of the present invention, to ensure that no miscounts occur in 1000 comparison cycles the following condition must be met:

$V_{out\ final}$−$V_{out\ initial}$=$V_{expected\ shift}$+/−½$V_{one\_miscount}$=−5.875+/−0.023 mV (8)

where $V_{expected\_shift}$=slope of $V_{out}$* wait time=−0.094 V/s*62.5 mS=−5.875 mV. It should be understood that Vout comprises the output from amplifier 47 (see FIG. 5). One miscount by the MAIN counter 2 would cause the pulse width of CPOUT to change by:

Delta_width=1/MAIN$_{freq}$=1/2098.1 MHz=0.4766 nS, (9)

so

V_shift$_{one\_miscount}$ = (Delta_width/comparison period) * $V_{out\ max}$ (10a)

= 0.4766 nS/62.5yS) * 6.075 V = 46.3 uV (10b)

In an illustrative embodiment of the present invention, power levels (e.g., voltages) of the first or second signals input into the counters 2,3 can be repeatedly altered until a change from a predicted or expected voltage is detected. That is, it is expected that the first time the power level of either one of the two signals is altered no change in voltage will occur. However, after either signal is altered such that its power level falls outside the limits of the MAIN or REF counter, a miscount will be generated which in turn generates an altered waveform which, thereafter, can be detected and/or displayed by sampling unit 45.

When a PLL stabilization unit, such as unit 1000 in FIG. 2, is first made, the limits of the MAIN and REF counters are not yet known though they can be predicted based on the unit's design. The present invention allows design engineers and others to compare the limits predicted by a certain design to the actual limits of counters while they are operating.

When a miscount is generated by the MAIN or REF counter 2,3 a miscount error signal is generated by phase detector 11. This miscount error signal is then used by charge pump 4 to generate CPOUT. If a miscount occurs in either counter, then the pulse width of CPOUT will become longer or shorter than expected. After being integrated and amplified, a lengthened or shortened CPOUT will cause a DC shift (i.e., altered waveform) which can be detected and/or displayed by sampling unit 45.

Figure 4A:
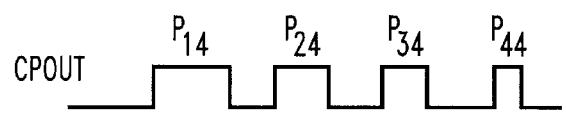
FIGS. 4a and 4b depict a pulse train and waveform, respectively, output by an inaccurately operating PLL stabilization unit according to one embodiment of the present invention.
Figure 4B:
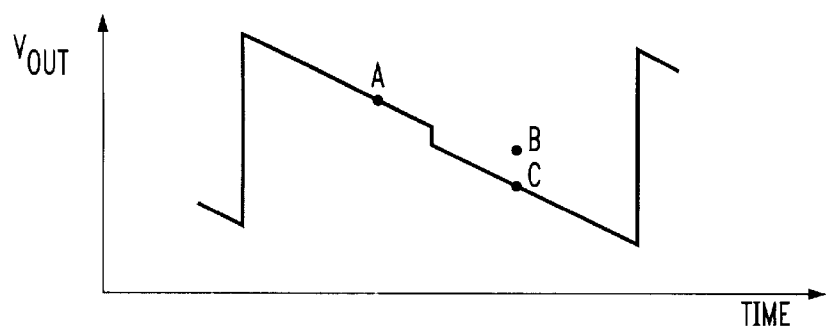

FIGS. 4a and 4b show the effects on CPOUT and $V_{out}$, respectively, caused by a miscount according to one example of the present invention. Comparing the pulse width of pulse P33 in FIG. 3a with the pulse width of pulse P34 in FIG. 3b, a miscount causes P34 to shorten.

In an illustrative embodiment of the invention, the voltage-sampling unit 45 is adapted to detect a shift in voltage from point B to C in FIG. 4b. The sampling unit 45 can be further adapted to detect whether the voltage associated with point C comprises a point along the predicted slope of the predetermined waveform or along an altered waveform. It should be realized that this is just one way to compare the altered waveform against the predetermined waveform to determine if a miscount has occurred. If point C does not fall on the predicted slope, then a miscount has occurred. In effect, the miscount causes the shift in voltage from point B to point C shown in FIG. 4b.

In the discussion above, a small beat frequency was used to illustrate the present invention. The invention is not so limited, however. In an alternative embodiment of the invention, the predetermined waveform may also comprise a zero beat frequency. Under certain circumstances (e.g., severe miscounting), however, such an embodiment may not reliably detect miscounts. A zero beat frequency can be generated by setting the first frequency substantially equal to the second frequency (or vice-versa).

It should be understood that the present invention assumes that the miscounts generated by counters 2,3 will not be self-canceling. This is a safe assumption given the fact that the chances of this condition occurring is extremely small.

Referring to FIG. 5, there is shown an example of an integrator or integration means 46. In an illustrative embodiment of the present invention, the integrator 46 is adapted to convert signals received from the charge pump 4 into DC levels which can then be measured and/or displayed by the sampling unit 45. It should be noted that even though the integrator 46 is shown as being a part of the sampling unit 45 in FIG. 2, the invention is not so limited. Rather, some or all of the integrator 46 may be made a part of the sampling unit 45, may be a standalone unit, or may be made a part of the PLL stabilization unit 1000.

In the example shown in FIG. 5, the integrator 46 is shown comprising capacitance C resistances R1 and R2 and amplifier or amplifying means 47. Strictly speaking, it is the capacitance C and resistance R1 which are adapted to carry out the conversion to a DC level while the amplifier 47 increases this level to a one which is compatible with the voltage sampling unit 45. In an illustrative embodiment of the invention, the value of C comprises 0.047 $\mu f$, and the value of R1 comprises 500 ohms. It should be understood that these values are just for illustration purposes and that they may be changed to fit the RC time constant desired. In general, the time constant represented by R1×C should be set fairly high as compared with the comparison period to minimize the amount of ripple seen by the sampling unit 45. However, C must be small enough that the charge pump 4 can easily drive the capacitive load. In addition, R1 must be small enough so that signals received from the charge pump 4 can drive R1 without reaching the compliance voltage of charge pump 4. Setting R1 at 500 ohms and C at 0.047 $\mu f$ corresponds to a time constant of 23.5 uS which results in an acceptable ripple level. It should be noted that resistance R2 is adapted to set the gain of the amplifier 47 and that the configuration shown in FIG. 5 is "inverting" where $V_{out\ max}$ is equal to $-1 * R2 * CPOUT_{max-current}$.

Figure 6:
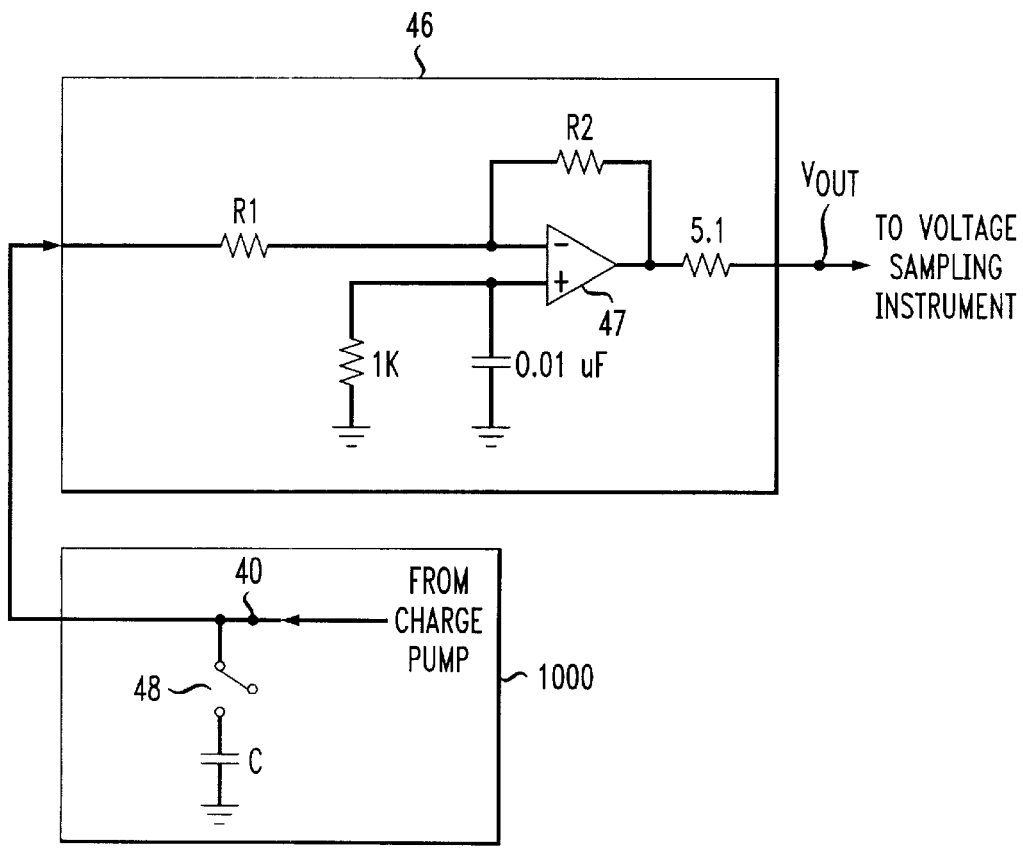
FIG. 6 depicts another example of an integrator according to yet another embodiment of the invention.

Though the integrator 46 is shown as one unit, the invention is not so limited. The present invention envisions alternative embodiments where the integrator 46 is broken down into two or more units. For example, the amplifier 47 may be a standalone unit, may be made a part of the sampling unit 45 or a part of the PLL stabilization unit 1000. Similarly, the capacitance C may be made a part of the unit 1000 and may be combined with a switching unit 48 adapted to connect/disconnect the capacitance C from unit 1000. Though shown as being a part of unit 1000 in FIG. 6, switching unit 48 may also be a stand-alone unit.

Regardless of the actual embodiment, it should be understood the resistance R1, R2, capacitance C, amplifier 47, and switching unit 48 may comprise integrated or discrete circuits or components.

It should be further understood that the first and second signals 9a, 9b may be input in any order (e.g., first followed by second or vice-versa) without affecting methods envisioned by the present invention.

It is to be further understood that changes and variations may be made to the examples given above without departing from the spirit and scope of this invention as defined by the claims that follow.

We claim:

1. A method of testing the operation of a phase locked-loop comprising:

generating a difference signal from the outputs of a first and a second frequency counter;

generating an altered waveform from the difference signal;

comparing the altered waveform to a predetermined waveform to determine the operation of at least one of said frequency counters.

2. The method of claim 1, wherein generating the altered waveform further comprises integrating the difference signal.

3. The method of claim 2, wherein the integration step further comprises using a time constant which minimizes ripple.

4. The method of claim 3, wherein the time constant comprises a resistance small enough to avoid reaching a compliance voltage.

5. The method as in claim 1 further comprising inputting a first signal into an input of the first frequency counter and inputting a second signal into an input of the second frequency counter.

6. The method of claim 5, further comprising increasing the frequency of said first signal until the difference signal fails to meet a predetermined standard.

7. The method of claim 5, further comprising increasing the frequency of said second signal until the difference signal fails to meet a predetermined standard.

8. The method of claim 1, wherein a frequency of the first signal is substantially equal to a frequency of the second signal.

9. A device for testing the operation of a phase locked-loop comprising:

an integrator adapted to generate an altered waveform from a difference signal, wherein the difference signal is derived from outputs of a first and a second frequency counter and further adapted to compare the altered waveform to a predetermined waveform to determine the operation of at least one of said frequency counters.

10. The device as in claim 9, wherein the integrator is further adapted to integrate the difference signal.

11. The device as in claim 10, wherein the integrator is further adapted to integrate the difference signal using a time constant which minimizes ripple.

12. The device as in claim 11, wherein the time constant comprises a resistance small enough to avoid reaching a compliance voltage.

13. The device as in claim 9 further comprising a first signal generator adapted to input a first signal into the first frequency counter and a second signal generator adapted to input a second signal into the second frequency counter.

14. The device as in claim 13, wherein the first signal generator can be adapted to increase a frequency of the first signal until the difference signal fails to meet a predetermined standard.

15. The device as in claim 13, wherein the second signal generator can be adapted to increase a frequency of the second signal until the difference signal fails to meet a predetermined standard.

16. The device as in claim 13, wherein a frequency of the first signal is substantially equal to a frequency of the second signal.

17. The device as in claim 13, wherein the first generator and said second generators are adapted to be independently adjustable.

18. The device as in claim 9 wherein the device comprises an integrated circuit.

* * * * *